United States Patent
He

(10) Patent No.: US 10,826,506 B2
(45) Date of Patent: Nov. 3, 2020

(54) MODULUS DIVIDER WITH DETERMINISTIC PHASE ALIGNMENT

(71) Applicant: Integrated Device Technology, Inc., San Jose, CA (US)

(72) Inventor: Chengming He, Chandler, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 212 days.

(21) Appl. No.: 15/831,580

(22) Filed: Dec. 5, 2017

(65) Prior Publication Data

US 2019/0173476 A1    Jun. 6, 2019

(51) Int. Cl.

| H03K 21/00 | (2006.01) |
|---|---|
| H03K 23/00 | (2006.01) |
| H03L 7/193 | (2006.01) |
| H03K 21/10 | (2006.01) |
| H03L 7/23 | (2006.01) |
| H03K 21/02 | (2006.01) |
| H03L 7/18 | (2006.01) |
| H03K 23/58 | (2006.01) |
| H03K 23/54 | (2006.01) |

(52) U.S. Cl.
CPC .......... *H03L 7/193* (2013.01); *H03K 21/026* (2013.01); *H03K 21/10* (2013.01); *H03K 23/588* (2013.01); *H03L 7/1806* (2013.01); *H03L 7/23* (2013.01); *H03K 23/54* (2013.01)

(58) Field of Classification Search
None
See application file for complete search history.

(56) References Cited

U.S. PATENT DOCUMENTS

| 8,218,712 | B1* | 7/2012 | Jiang | H03K 23/546 327/115 |
|---|---|---|---|---|
| 8,565,368 | B1* | 10/2013 | Chen | H03K 23/68 377/47 |
| 9,118,333 | B1* | 8/2015 | Mika | H03K 23/70 |
| 2004/0036513 | A1* | 2/2004 | Gibbons | H03K 23/667 327/117 |
| 2005/0058236 | A1* | 3/2005 | Ke | H03K 23/667 377/49 |
| 2013/0027111 | A1* | 1/2013 | Chen | H03K 23/662 327/360 |
| 2014/0002569 | A1* | 1/2014 | Yuno | B41J 3/4075 347/218 |
| 2014/0312936 | A1* | 10/2014 | Abdel-Haleem | H03L 7/193 327/118 |
| 2016/0308536 | A1* | 10/2016 | Cali | H03K 21/026 |
| 2018/0323792 | A1* | 11/2018 | Deng | H03L 7/193 |
| 2019/0036533 | A1* | 1/2019 | Yanagihara | H03K 23/64 |

* cited by examiner

*Primary Examiner* — Tuan T Lam
(74) *Attorney, Agent, or Firm* — Christopher P. Maiorana, PC

(57) ABSTRACT

An apparatus includes a plurality of latches and a plurality of logic gates. Each latch may be setable and resettable. The logic gates may be connected to the latches to form a multi-modulus divider that generates an output clock signal by dividing an input clock signal in response to a command signal. Each latch may be commanded into a corresponding initial state while the command signal is in an initialization state. Each latch is generally free to change states while the command signal is in a run state. A modulus division operation of the multi-modulus divider may start upon an initial edge of the input clock signal after the command signal changes from the initialization state to the run state.

20 Claims, 4 Drawing Sheets

MODULUS DIVIDER WITH DETERMINISTIC PHASE ALIGNMENT

FIELD OF THE INVENTION

The invention relates to modulus dividers generally and, more particularly, to a method and/or apparatus for implementing a modulus divider with deterministic phase alignment.

BACKGROUND

Phase relationships are important for multiple-input-multiple-output antenna configurations, beam-forming and fast data transmissions in fifth generation wireless communication systems. Phase information is typically determined by a clock signal generated from a single high-frequency source and divided to create an intended-frequency clock signal. However, conventional clock dividers do not guarantee a deterministic phase relation between the high-frequency source clock signal and the intended-frequency clock signal. The problem is particularly noticeable at start-up where an initial transition in the intended-frequency clock signal has a random relationship to an initial transition in the high-frequency source clock signal.

It would be desirable to implement a modulus divider with deterministic phase alignment.

SUMMARY

The invention concerns an apparatus including a plurality of latches and a plurality of logic gates. Each latch may be setable and resettable. The logic gates may be connected to the latches to form a multi-modulus divider that generates an output clock signal by dividing an input clock signal in response to a command signal. Each latch may be commanded into a corresponding initial state while the command signal is in an initialization state. Each latch is generally free to change states while the command signal is in a run state. A modulus division operation of the multi-modulus divider may start upon an initial edge of the input clock signal after the command signal changes from the initialization state to the run state.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a modulus divider with deterministic phase alignment that may (i) always start dividing on a correct clock edge, (ii) utilize a set/reset technique to start dividing the modulus divider from a known state, (iii) divide a clock signal by one among multiple programmable integer values and/or (iv) be implemented as one or more integrated circuits.

Various embodiments of the invention generally provide a multi-modulus divider that may be commanded into a known initial state and/or auto-settle to a correct initial state using set controls and/or reset controls. From the correct initial state, the multi-modulus divider may always generate a correct initial edge in an output clock signal relative to an initial edge in an input clock signal. The multi-modulus divider may be used in multiple applications, such as microwave frequency band frequency synthesizers, time cards for base stations, small soft-defined radio transceivers, data center line cards and point-to-point communication devices.

Figure 1:
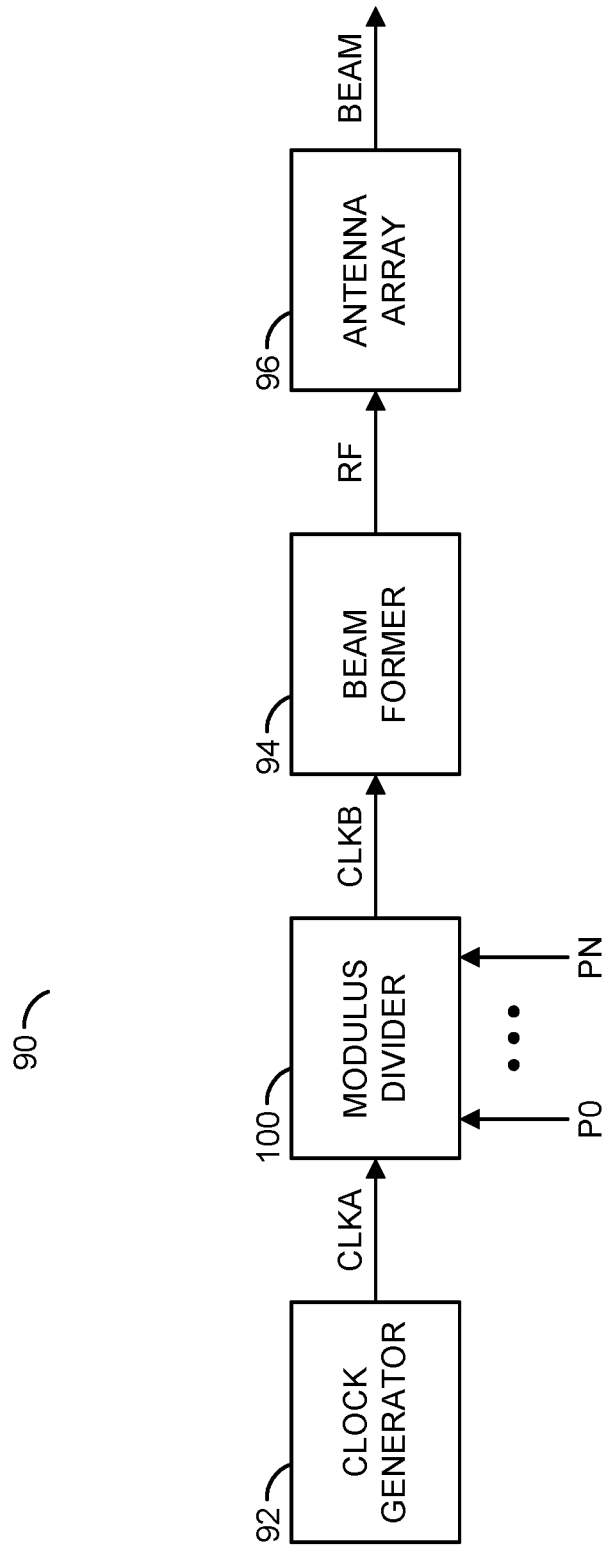
FIG. 1 is a block diagram of a system illustrating a context of the invention.

Referring to FIG. 1, a block diagram of a system 90 illustrating a context of the invention is shown. The system (or module or circuit or apparatus) 90 may implement a radio frequency (RF) transceiver system in accordance with an example embodiment of the invention. The RF transceiver system 90 may be configured to operate at common wireless radio frequencies, millimeter-wave frequencies, and/or microwave frequencies. In various embodiments, the RF transceiver system 90 may form part of a long range communications link. In various embodiments, the long range communications link may be part of a fifth generation (5G) wireless communications system (e.g., for which a standard is currently under development by the Next Generation Mobile Networks (NGMN) Alliance). In other embodiments, the long range communications link may be part of a fourth generation (4G) wireless communications system (e.g., International Mobile Telecommunications-Advanced (IMT-A) standard published by the International Telecommunications Unit Radiocommunication Sector (ITU-R)). However, other communications standards may be implemented to meet the design criteria of a particular application.

The RF transceiver system 90 may include a configurable multi-modulus divider (or prescaler) to facilitate clocking frequency divisions with a deterministic phase relationship. Achieving the proper phase relationship and proper clocking frequency division generally supports effective beam-forming in the RF transceiver system 90. Local oscillator clocking signals based on the multi-module divider may be distributed to multiple mixers. Combiner may subsequently add different RF signals in the correct phase relationships to generate high signal-to-noise beams. The multi-modulus divider may be fabricated using common semiconductor processes. With some semiconductor processes, the multi-modulus divider may work at input clock frequencies of up to 50 GHz or more where the divider is operated in a divide-by-2 mode.

The RF transceiver system 90 generally comprises a block (or circuit) 92, a block (or circuit) 94, a block (or circuit) 96 and a block (or circuit) 100. The circuits 92-100 may be implemented with hardware, a combination of hardware and software and/or simulated with software.

A signal (e.g., CLKA) may be generated by the circuit 92 and received by the circuit 100. The signal CLKA may implement a high-frequency (or input) clock signal. A signal (e.g., CLKB) may be generated by the circuit 100 and received by the circuit 94. The signal CLKB may implement a divided (or output) clock signal. One or more signals (e.g., P0 to PN) may be received by the circuit 100. The signal P0 to PN may carry programming values (e.g., $p_0$ to $p_N$, respectively) used to establish a division ratio in the circuit 100. A signal (e.g., RF) may be exchanged between the circuit 94 and the circuit 96. The signal RF may be a radio frequency signal that conveys the information to be transmitted by the RF transceiver system 90 and/or information received by the RF transceiver system 90. A field (e.g., BEAM) may be generated by the circuit 98. The field BEAM may represent a field pattern (or radio frequency beam pattern) created by the circuit 94.

The circuit 92 may implement a clock generator circuit. The clock generator circuit 92 is generally operational to generate the input clock signal CLKA at a known frequency. A frequency of the input clock signal CLKA may commonly be in a range of 2 GHz to 50 GHz. In some embodiments, the clock signal CLKA frequency may be in a range of 2 GHz to 30 GHz. In various embodiments, the clock generator circuit 92 may be implemented as one or more integrated circuits.

The circuit 94 may implement a beam former circuit. The beam former circuit 94 is generally operational to generate the radio frequency signal RF in a transmit mode and receive the radio frequency signal RF in a receive mode. In various embodiments, the radio frequency signal RF may be in a range of frequencies centered around approximately 28 gigahertz (GHz) or 39 GHz (e.g., 24 GHz to 30 GHz or 37 GHz to 44 GHz). The beam former circuit 94 generally comprises multiple (e.g., N) transceiver channel circuits. The beam former circuit 94 may also be operational to change phase values and gain values rapidly used by the transceiver channel circuits to steer the field BEAM formed by the circuit 96. In various embodiments, the beam former circuit 94 may be implemented as one or more integrated circuits.

The circuit 96 may implement an antenna array. The antenna array 96 may be operational to transmit and receive wireless signals to and from devices (or terminals) remotely located from the RF transceiver system 90. Sensitivity to the wireless signals may be determined by the field BEAM created by the antenna array 96. The antenna array 96 may comprise a number (e.g., N) of antenna elements. The N transceiver channel circuits of the beam former circuit 94 may be coupled by the bidirectional signal RF to the N antenna elements. A physical positioning of the N antenna elements generally provides a two-dimensional (e.g., horizontal and vertical) control of the field BEAM. In various embodiments, the antenna array 96 may be implemented as a patch antenna or a phased array antenna.

The circuit 100 may implement a modulus divider circuit. The modulus divider circuit 100 is generally operational to generate the output clock signal CLKB by dividing the input clock signal CLKA by one of several possible integer values. The integer values are generally determined by the binary values $p_0$ to $p_N$ received in the programming (or configuration) signals P0 to PN. In various embodiments, the integer value may be $2^N + p_0 2^0 + p_1 2^1 + \ldots + p_N 2^N$. For example, where N=2, the multi-modulus divider may divide by selectable integer values of 4, 5, 6 or 7. In various embodiments, the modulus divider circuit 100 may be implemented as one or more integrated circuits.

Figure 2:
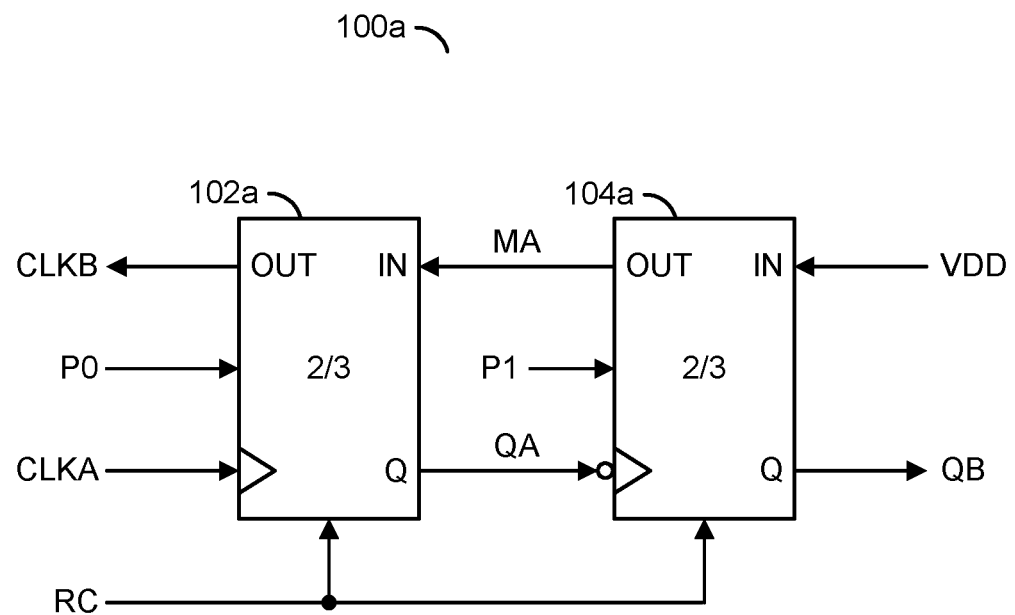
FIG. 2 is a block diagram of a modulus divider circuit in accordance with an embodiment of the invention.

Referring to FIG. 2, a block diagram of an example implementation of a modulus divider circuit 100*a* in accordance with an embodiment of the invention is shown. The modulus divider circuit 100*a* may be representative of the modulus divider circuit 100 shown in FIG. 1. The modulus divider circuit 100*a* generally comprises a block (or circuit) 102*a* and a block (or circuit) 104*a*. The circuits 102*a*-104*a* may be implemented with hardware, a combination of hardware and software and/or simulated with software.

The input clock signal CLKA may be received at an active high clock input node of the circuit 102*a*. The output clock signal CLKB may be generated at a clock output node of the circuit 102*a*. The programming signal P0 may be received by the circuit 102*a*. The programming signal P1 may be received by the circuit 104*a*.

A signal (e.g., QA) may be generated at a data output node of the circuit 102*a* and received at an active low clock input node of the circuit 104*a*. The signal QA may be an intermediate clock signal (or data signal) used to clock the circuit 104*a*. A feedback signal (e.g., MA) may be generated at an output node of the circuit 104*a* and received at an input node of the circuit 102*a*. The feedback (or intermediate output) signal MA may be a divided version of the intermediate clock signal QA. A signal (e.g., QB) may be generated at a data output node of the circuit 104*a*. The signal QB may be another intermediate clock signal (or data signal) useful where additional ⅔ modulus dividers are implemented. A signal (e.g., VDD) may be received at an input node of the circuit 104*a*. The signal VDD may be a steady-state power supply voltage in a particular state (e.g., a high voltage or a logical one state). A signal (e.g., RC) may be received by each circuit 102*a* and 104*a*. The signal RC may implement a reset command signal. The reset command signal RC may alternately convey an initialization state (e.g., a high voltage or a logical one state) and a run state (e.g., a low voltage or a logical zero state).

The circuit 102*a* may implement a dual-modulus divider circuit. The dual-modulus divider circuit 102*a* is generally operational to generate the output clock signal CLKB based on the input clock signal CLKA, the feedback signal MA, the reset command signal RC, and the binary value $p_0$ received in the programming signal P0. In various embodiments, the dual-modulus divider circuit 102*a* may implement a ⅔ modulus divider circuit 102*a*. While the binary value $p_0$ has a low state (e.g., the low voltage or the logical zero state), the dual-modulus divider circuit 102*a* may generate the output clock signal CLKB as an integer division (e.g., ÷2) of the input clock signal CLKA. While the binary value $p_0$ has a high state (e.g., the high voltage or the logical one state), the dual-modulus divider circuit 102*a* may generate the output clock signal CLKB as another integer division (e.g., ÷3) of the input clock signal CLKA.

The circuit 104*a* may implement a dual-modulus divider circuit. The dual-modulus divider circuit 104*a* is generally operational to generate the feedback signal MA based on the intermediate clock signal QA, the steady-state power supply voltage VDD, the reset command signal RC, and the binary value $p_1$ received in the programming signal P1. In various embodiments, the dual-modulus divider circuit 104*a* may implement a ⅔ modulus divider circuit 104*a*. While the binary value $p_1$ has a low state (e.g., the low voltage or the logical zero state), the dual-modulus divider circuit 104*a* may generate the feedback signal MA as an integer division (e.g., ÷2) of the intermediate clock signal QA. While the binary value $p_1$ has a high state (e.g., a high voltage or a logical one state), the dual-modulus divider circuit 102*a* may generate the feedback signal MA as another integer division (e.g., ÷3) of the intermediate clock signal QA.

By rearranging a clocking sequence in the cascaded ⅔ modulus divider circuits 102*a* and 104*a*, a speed of the modulus divider circuit 100*a* may be enhanced compared with common multi-modulus divider designs. For example, a common mode logic latch based multi-modulus divider fabricated in a 0.13 micrometer (μm) CMOS process is typically limited to a 5 gigahertz (GHz) input clock frequency. By comparison, the architecture of invention generally enhances the speed to 7 GHz to 8 GHz for the input clock frequency when fabricated in the same 0.13 μm CMOS process. Furthermore, some common dividers have an internal loop-state-machine that must settle to produce a correct division. Before the loop-state-machine settles, such common dividers can generate incorrect divisions and so cannot be used as a phase-alignment divider. With the reset-set controls, embodiments of the invention may generate the first division correctly and generate all subsequent divisions correctly.

Figure 3:
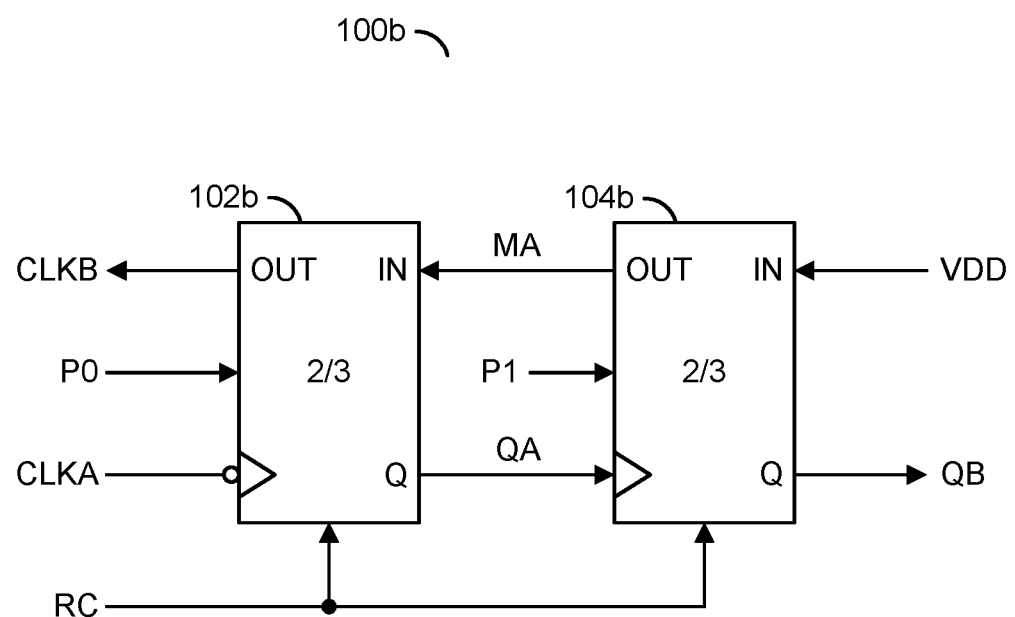
FIG. 3 is a block diagram of another modulus divider circuit in accordance with an embodiment of the invention.

Referring to FIG. 3, a block diagram of another example implementation of a modulus divider circuit 100b in accordance with an embodiment of the invention is shown. The modulus divider circuit 100b may be representative of the modulus divider circuit 100 shown in FIG. 1. The modulus divider circuit 100b generally comprises a block (or circuit) 102b and a block (or circuit) 104b. The circuits 102b and 104b may be implemented with hardware, a combination of hardware and software and/or simulated with software.

The circuit 102b may be a variation of the multi-modulus divider circuit 102a with an active low clock input node receiving the input clock signal CLKA. The circuit 104b may be a variation of the multi-modulus divider circuit 104a with an active high clock input node receiving the intermediate clock signal QA. As such, the modulus divider circuit 100b may be a variation of the modulus divider circuit 100a with the output clock signal CLKB shifted by 180 degrees.

Figure 4:
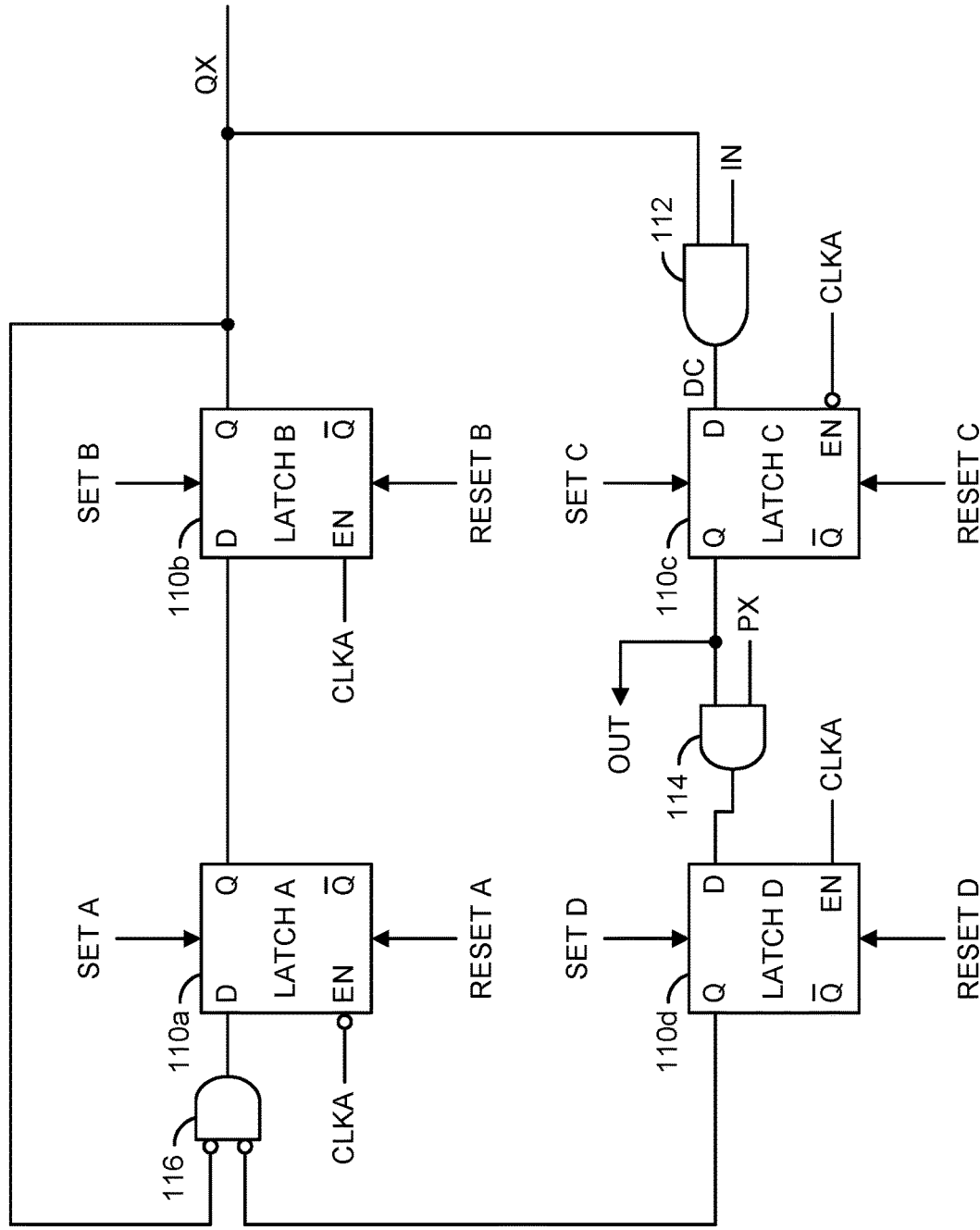
FIG. 4 is a schematic diagram of a multi-modulus divider circuit.

Referring to FIG. 4, a schematic diagram of an example implementation of the multi-modulus divider circuit is shown. The multi-modulus divider circuit 104a may be a copy of the multi-modulus divider circuit 102a, as illustrated, with different input signals and output signals. The multi-modulus divider circuit 102a generally comprises multiple blocks (or circuits) 110a to 110d, a block (or circuit) 112, a block (or circuit) 114 and a block (or circuit) 116. The circuits 110a-116 may be implemented with hardware, a combination of hardware and software and/or simulated with software.

The clock signals CLKA (102a) and QA (104a) may be received at an active high enable node of the corresponding circuits 110a and 110c. The clock signals CLKA/QA may also be received at an active low enable node of the corresponding circuits 110b and 110d. A signal (e.g., IN) may be received at an input node of the circuit 112. The signal IN may be representative of the signals MA (102a) and VDD (104a). A signal (e.g., QX) may be generated at a data output node of the circuit 110b and received by another input node of the circuit 112 and an input node of the circuit 116. The signal QX may be representative of the signals QA (102a) and QB (104a). The circuit 112 may generate signal (e.g., DC) at an output node as a Boolean combination of the signal QX and the signal IN. The signal DC may be received at a data input node of the circuit 110c.

The circuit 110c may generate a signal (e.g., OUT) at a data output node. The signal OUT may be received at an input node of the circuit 114 and presented outside the multi-module divider circuits 102a and 104a. The signal OUT may be representative of the signals CLKB (102a) and MA (104a). A signal (e.g., PX) may be received at another input node of the circuit 114. The signal PX may be representative of the signals P0 (102a) and P1 (104a).

A data output node of the circuit 110d may be connected to another input node of the circuit 116. An output node of the circuit 116 may be connected to a data input node of the circuit 110a. The circuit 110a may have a data output node connected to a data input node of the circuit 110b. Multiple signals (e.g., SET A to SET D) may be received at set nodes of the circuits 110a to 110d, respectively. Multiple signals (e.g., RESET A to RESET D) may be received at reset nodes of the circuits 110a to 110d, respectively.

Each of the circuits 110a to 110d may implement a latch circuit. Each latch circuit 110a to 110d may be operational to latch (or buffer) a binary value at the corresponding data input node (e.g., node D) while the signal received at the enable node (e.g., node EN) is active. The binary value buffered in each latch circuit 110a to 110d may be presented at a corresponding data output node (e.g., node Q).

Each latch circuit 110a to 110d may be setable and resettable. The latch circuits 110a to 110d may be responsive to an active value in the signals SET A to SET D to set the buffered value stored within, and presented in at the data output node Q to a high voltage (or the logical one state). The latch circuits 110a to 110d may be responsive to an active value in the signals RESET A to RESET D to reset the buffered value stored within, and presented at the data output node Q to a low voltage (or the logical zero state).

The circuit 112 may implement a logical AND gate with active high input nodes. The logical AND gate (or logic gate) 112 may be operational to generate the signal DC as a Boolean AND of the signal QX and the signal IN.

The circuit 114 may implement another logical AND gate with active high input nodes. The logical AND gate (or logic gate) 114 may be operational to generate a Boolean AND of the signal PX and the signal OUT.

The circuit 116 may implement a logical AND gate with active low inputs nodes. The logical AND gate (or logic gate) 116 may be operational to generate a Boolean AND of the inverse signal QX and an inverse of the data latched in the latch circuit 110d.

The signal SET A may be permanently fixed to the low voltage (e.g., inactive). The signal RESET A may be generated to match the reset control signal RC. While the reset control signal RC and the signal RESET A have the logical one state, the latch circuit 110a may reset the internally latched value to the logical zero state. While the reset control signal RC and the signal RESET A have the logical zero state, the latch circuit 110a may be free to change the internally latched value to the binary value received at the date input node D while the input clock signal CLKA is low (due to the active low clock node of the latch circuit A).

The signal RESET B may be permanently fixed to the low voltage (e.g., inactive). The signal SET B may be generated to match the reset control signal RC. While the reset control signal RC and the signal SET B have the logical one state, the latch circuit 110b may set the internally latched value to the logical one state. While the reset control signal RC and the signal SET B have the logical zero state, the latch circuit 110b may be free to change the internally latched value to the binary value received at the date input node D while the input clock signal CLKA is high.

The signal RESET C may be permanently fixed to the low voltage (e.g., inactive). The signal SET C may be generated to match the reset control signal RC. While the reset control signal RC and the signal SET C have the logical one state, the latch circuit 110c may set the internally latched value to the logical one state. While the reset control signal RC and the signal SET C have the logical zero state, the latch circuit 110c may be free to change the internally latched value to the binary value received at the date input node D while the input clock signal CLKA is low (due to the active low clock node of the latch circuit C).

The signal set D may be generated as a Boolean AND of the reset control signal RC and the signal PX. The signal RESET D may be generated as a Boolean AND of the reset control signal RC and an inverse of the signal PX. If the signal PX is programmed to the logical one state, the signal SET D may follow the reset signal RC, and the signal RESET D may stay in the logical zero state independent of the reset signal RC while the input clock signal CLKA is active. If the signal PX is programmed to the logical zero state, the signal SET D may stay is the logical zero state independent of the reset signal RC, and the signal RESET D may follow the reset signal RC while the input clock signal CLKA is active.

Figure 5:
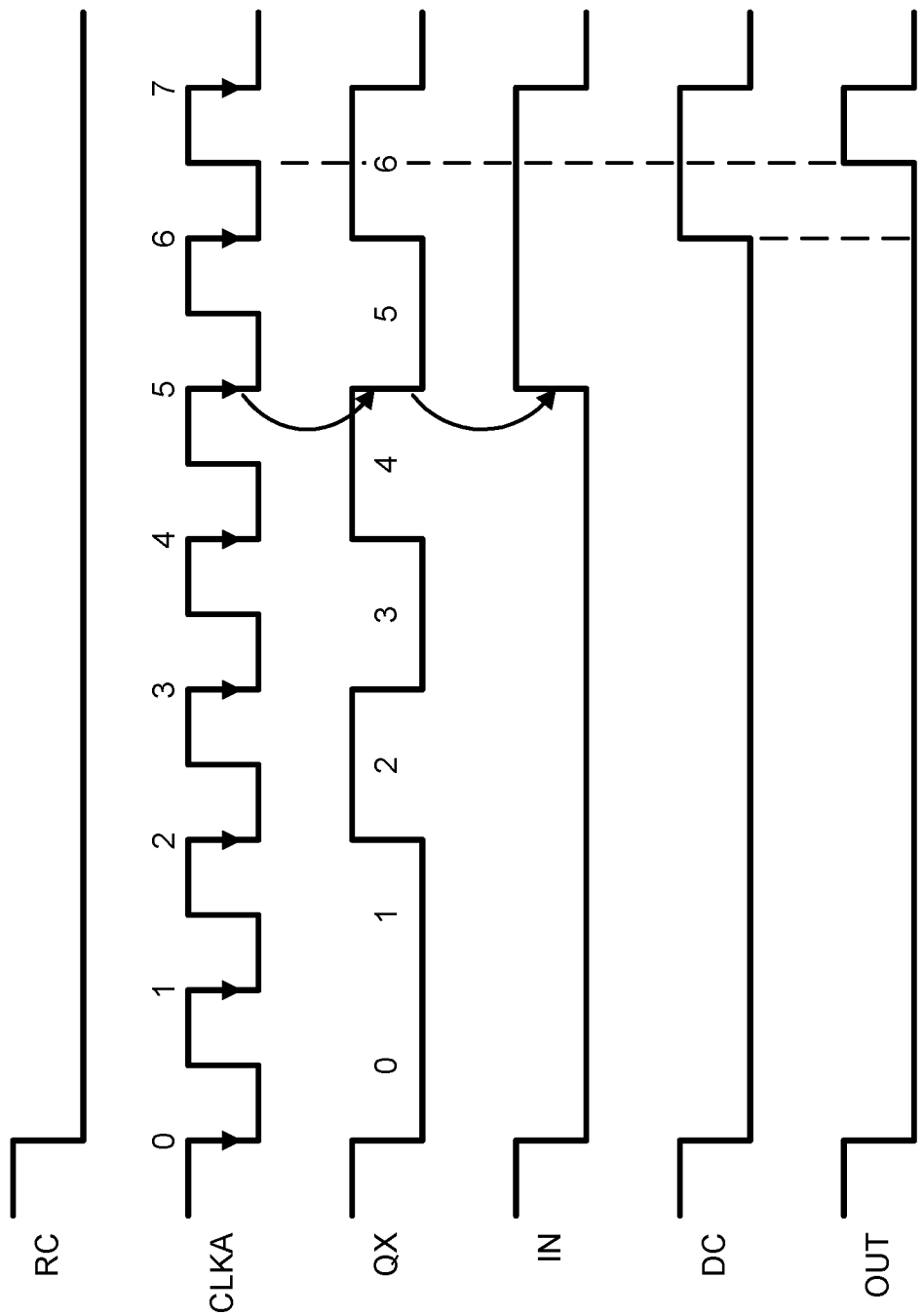
FIG. 5 is a timing diagram of several signals in the modulus divider.

Referring to FIG. 5, a timing diagram of several signals in the modulus divider 100 in an example operation is shown. The example illustrates both the programming signals P0 and P1 in the logical one state (e.g., divide by seven). While the reset control signal RC is in a reset state (e.g., the high voltage or the logical one state), all of the latch circuits 110a to 110d may be set/reset accordingly. Setting or resetting all of the latch circuits 110a to 110d in both multi-modulus divider circuits 102a and 104a generally places the modulus divider circuit 100 in a known initial state.

Referring again to FIG. 4, while the reset control signal RC is in the logical one state, the latch circuit 110a may be reset. While both the reset control signal RC and the feedback signal IN (e.g., the signal MA generated by 104a) are in the logical one state, the signals QX, DC and OUT (e.g., the signal CLKB generated by 102a) may all be generated in the logical one state. In particular, the latch circuit 110b may be set so the signal QX=1, the latch circuit 110c may be set so the signal OUT=1 and DC=QX AND IN so DC=1. The latch circuit 110d may be set or reset depending on the values in the signal P0 (P0=P1=1 in the example). While the reset signal RC is in a running state (e.g., the low voltage or the logical zero state), all of the latch circuits 110a to 110d may be free to update the internally latched values while enabled.

The logical zero state following an initial edge (e.g., a falling edge 0) in the input clock signal CLKA after the reset signal RC is in the running state, may cause the latch circuit 110b to update the signal QX to the logical zero state (e.g., the data node Q matches the logical zero state received at the data input node D due to the reset latch circuit 110a.) The logical zero state of the signal QX may cause the logical AND gate 112 to change the signal DC to the logical zero state. The feedback signal IN may also transition to the logical zero state due to the set/reset operations in the multi-modulus divider circuit 104a.

The logical zero state of the signal DC while the input clock signal CLKA is in the logical zero state (e.g., active low) generally allows the latch circuit 110c to latch the logical zero state of the signal DC and drive the signal OUT to the logical zero state. The latch circuit 110b may hold the signal QX in the logical low state for two cycles (e.g., clock cycles 0 and 1) of the input clock signal CLKA.

Stating with the second clock cycle of the signal CLKA, the latch circuit 110c may generate the signal QX at half the frequency of the input clock signal CLKA. At the fifth falling edge after the reset control signal RC enters the running state, the latch circuit 110c may transition the signal QX to the logical zero state and the multi-modulus division circuit 104a may transition the feedback signal IN to the logical one state. At the sixth falling edge after the reset control signal RC enters the running state, the logical AND gate 112 generates the signal DC in the logical one state as the Boolean operation QX AND IN.

While the input clock signal CLKA returns to the logical one state midway through the sixth clock cycle, the latch circuit 110c may transfer the logical one state in the signal DC to the signal OUT. When the input clock signal CLKA transitions to the logical zero state at the seventh clock edge after the reset control signal RC enters the running state, the multi-modulus divider circuit 104b may transition the feedback signal IN to the logical zero state. The logical zero state of the feedback signal IN generally causes the logical AND gate 112 in the multi-modulus divider circuit 102a to generate the signal DC in the logical zero state. While the input clock signal CLKA is in the logical low state at the active low enable node of the latch circuit 110c, the latch circuit 110c may latch the logical zero state of the signal DC and generate the signal CLKB in the logical zero state. The single cycle of the signal IN (e.g., the signal CLKB generated by the circuit 102a) during the seven cycles of the input clock signal CLKA generally illustrates a divide by seven operation.

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 5 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a plurality of latches, each comprising a data input node, a set node, and a reset node, wherein a first number of said latches further comprise an active high enable node and a second number of said latches further comprise an active low enable node; and
   a plurality of logic gates connected to said latches to form a plurality of dual-modulus divider circuits making up a multi-modulus divider that generates an output clock signal by dividing an input clock signal in response to a command signal and a programming signal, wherein
   (i) each of said latches is placed in a corresponding initial state while said command signal is in an initialization state,
   (ii) each of said latches is free to change states while said command signal is in a run state,
   (iii) a modulus division operation of said multi-modulus divider starts upon an initial edge of said input clock signal after said command signal changes from said initialization state to said run state,
   (iv) a first of said dual-modulus divider circuits comprises (a) a first of said latches having said active low enable node receiving said input clock signal, said reset node receiving said command signal, and said set node set to an inactive state, (b) a second of said latches having said active high enable node receiving said input clock signal, said set node receiving said command signal, and said reset node set to said inactive state, (c) a third of said latches having said active low enable node receiving said input clock signal, said set node receiving said command signal, and said reset node set to said inactive state, and (d) a fourth of said latches having said active high enable node receiving said input clock signal, said set node receiving a logical combination of said command signal and said programming signal, and said reset node receiving a logical combination of said command signal and a complement of said programming signal, and
   (v) said output clock signal always has a correct phase alignment to said initial edge of said input clock signal.

2. The apparatus according to claim 1, wherein said input clock signal is a single phase of a source clock signal.

3. The apparatus according to claim 1, wherein a particular one of said logic gates receives both a feedback signal generated external to said multi-modulus divider and an intermediate clock signal generated by one of said latches.

4. The apparatus according to claim 3, wherein said intermediate clock signal transitions in response to said initial edge of said input clock signal.

5. The apparatus according to claim 1, wherein said modulus division is a division by a first integer while a said programming signal has a first state.

6. The apparatus according to claim 5, wherein said modulus division is a division by a second integer different than said first integer while said programming signal has a second state.

7. The apparatus according to claim 1, wherein while said command signal is in said initialization state (i) two of said latches are set, (ii) one of said latches is reset and (iii) one of said latches is either set or reset based on said programming signal.

8. The apparatus according to claim 1, wherein said modulus division operates at a clock frequency of up to 50 gigahertz.

9. The apparatus according to claim 1, wherein each of said dual-modulus divider circuits implements a ⅔ modulus division.

10. The apparatus according to claim 1, wherein said multi-modulus divider is configured as part of a fifth generation wireless communications system.

11. An apparatus comprising:
    a first circuit configured to (i) receive a command signal, an input clock signal, a first programming signal, and a feedback signal, and (ii) generate an intermediate clock signal and an output clock signal; and
    a second circuit configured to (i) receive said command signal, a second programming signal, and said intermediate clock signal, and (ii) generate said feedback signal, wherein
    (a) each of a plurality of latches in both said first circuit and said second circuit comprises either an active high enable node or an active low enable node, a data input node, a set node, and a reset node,
    (b) each of said plurality of latches is placed in a corresponding initial state while said command signal is in an initialization state,
    (c) each of said plurality of latches is free to change states while said command signal is in a run state,
    (d) a modulus division operation starts upon an initial edge of said input clock signal after said command signal changes from said initialization state to said run state,
    (e) said first circuit comprises (a) a first of said latches having said active low enable node receiving said input clock signal, said reset node receiving said command signal, and said set node set to an inactive state, (b) a second of said latches having said active high enable node receiving said input clock signal, said set node receiving said command signal, and said reset node set to said inactive state, (c) a third of said latches having said active low enable node receiving said input clock signal, said set node receiving said command signal, and said reset node set to said inactive state, and (d) a fourth of said latches having said active high enable node receiving said input clock signal, said set node receiving a logical combination of said command signal and said first programming signal, and said reset node receiving a logical combination of said command signal and a complement of said first programming signal, and
    (f) said output clock signal always has a correct phase alignment to said initial edge of said input clock signal.

12. The apparatus according to claim 11, wherein said input clock signal is a single phase of a source clock signal.

13. The apparatus according to claim 11, wherein a particular one of a plurality of logic gates in said first circuit receives both said feedback signal generated by said second circuit and said intermediate clock signal generated by one of said latches in said first circuit.

14. The apparatus according to claim 13, wherein said intermediate clock signal transitions in response to said initial edge of said input clock signal.

15. The apparatus according to claim 11, wherein said modulus division is a division by a first integer while said first and said second programming signals have a first state.

16. The apparatus according to claim 15, wherein said modulus division is a division by a second integer different than said first integer while said first and said second programming signals have a second state.

17. The apparatus according to claim 11, wherein while said command signal is in said initialization state (i) two of said latches in said first circuit are set, (ii) one of said latches in said first circuit is reset, and (iii) one of said latches in said first circuit is either set or reset based on said first programming signal.

18. The apparatus according to claim 11, wherein said modulus division operates at a clock frequency of up to 50 gigahertz.

19. The apparatus according to claim 11, wherein each of said first circuit and said second circuit implements a ⅔ modulus division circuit.

20. The apparatus according to claim 11, wherein said first circuit and said second circuit are configured as part of a fifth generation wireless communications system.

* * * * *